United States Patent [19]
Noren

[11] Patent Number: 4,706,739
[45] Date of Patent: * Nov. 17, 1987

[54] HEAT EXCHANGER

[76] Inventor: Don W. Noren, 846 Blandford Blvd., Redwood City, Calif. 94062

[ * ] Notice: The portion of the term of this patent subsequent to Jul. 15, 2003 has been disclaimed.

[21] Appl. No.: 872,815

[22] Filed: Jun. 11, 1986

Related U.S. Application Data

[63] Continuation-in-part of Ser. No. 727,588, Apr. 26, 1985, Pat. No. 4,600,050.

[51] Int. Cl.$^4$ .............................................. F28D 15/00
[52] U.S. Cl. .......................... 165/104.14; 165/104.33; 165/122; 361/384
[58] Field of Search ...................... 165/104.14, 104.33, 165/104.34; 361/384

[56] References Cited

U.S. PATENT DOCUMENTS

| | | | |
|---|---|---|---|
| 3,807,493 | 4/1974 | Stewart | 165/104.33 |
| 4,303,122 | 12/1981 | Powell | 165/104.33 |
| 4,386,651 | 6/1983 | Reinhard | 165/104.33 |
| 4,449,579 | 5/1984 | Miyazebi et al. | 165/104.33 |
| 4,600,050 | 7/1986 | Noren | 165/104.14 |

FOREIGN PATENT DOCUMENTS

| | | | |
|---|---|---|---|
| 2915712 | 10/1980 | Fed. Rep. of Germany | 165/104.14 |
| 1393510 | 2/1964 | France | 165/104.33 |
| 21441 | 2/1978 | Japan | 165/104.33 |
| 116038 | 9/1978 | Japan | 165/909 |

Primary Examiner—Albert W. Davis, Jr.
Attorney, Agent, or Firm—Fay, Sharpe, Beall, Fagan, Minnich & McKee

[57] ABSTRACT

A heat exchanger assembly for cooling the interior of a closed cabinet containing electronic components or the like includes a finned heat pipe core. The core has a plurality of spaced substantially parallel heat bodies as well as a plurality of spaced fins which are provided with colinear apertures through which each of the plurality of heat pipe bodies can extend. The finned heat pipe core is secured to an associated closed cabinet. A pair of fans are provided, one being operatively connected with each end of the finned heat pipe core. One of the fans and an associated first end of the heat pipe core is in contact only with the air inside the associated closed cabinet. The other of the fans and an associated second end of the finned heat pipe core is in contact only with the ambient air outside the associated cabinet. The fins have a spacing and a thickness which is sized to fit the performance curve of the fans.

17 Claims, 9 Drawing Figures

HEAT EXCHANGER

BACKGROUND OF THE INVENTION

This application is a continuation-in-part of application Ser. No. 727,588 filed on Apr. 26, 1985 now U.S. Pat No. 4,600,050 granted July 15, 1986.

This invention generally pertains to heat exchangers. More specifically, the present invention relates to a heat exchanger assembly which includes a plurality of heat pipes for cooling the interior of a closed cabinet.

The invention is particularly applicable to heat exchangers used in the cooling of electronic equipment in hostile industrial environments. However, it will be appreciated by those skilled in the art that the invention has broader applications and may also be adapted for use in many other environments where the cooling of a sealed cabinet is desired.

As is well known, heat transfer occurs in a heat pipe by means of phase change in the fluid—from liquid to vapor and then from vapor back to liquid. A thin-skinned cylindrical shell of a suitable heat conducting metal such a copper, encloses a wick and a suitable fluid. As heat is applied to an evaporator end of the heat pipe, the fluid is vaporized and travels to a condenser end thereof. As the vapor condenses, it gives up its latent heat of vaporization. Back in the liquid state, the fluid returns to the evaporator end of the heat pipe via a capillary action along the wick-lined walls thereof. At the evaporator end, the fluid is again reheated and vaporized.

Conventional heat pipes have been used to transfer heat in many different applications. For example, one known heat exchanger utilizes a plurality of heat pipes to remove heat from a sealed enclosure. As is well known, heat exchangers differ from air conditioners in that they cannot cool an enclosure below the ambient temperature. However, where the ambient atmosphere is not excessively hot (not above approximately 125° F.) or moisture laden, a heat exchanger can be used to transfer heat from inside a hot closed enclosure to the environment surrounding it.

In general, heat transfer between the interior of a closed chamber and its environment through a bank of heat pipes and fins with air driven by fans is quite complex and extremely difficult to describe mathematically. This is so since a phase change takes place in the working fluid of the heat pipe, there is a turbulent flow of air around the bank of heat pipes and fins caused by the fans, and the heat transfer takes place through convection between the working fluid and the heat pipe walls, conduction between the heat pipes and the fins, as well as through forced convection as the fan blows air around the heat pipes and fins.

In one known heat exchanger, a plurality of heat pipes and fins are provided in a large box which is adapted to be bolted onto an enclosure. Two separate air circulation systems, each using two blowers, are used to transfer the heat from the enclosure to the environment. Heat from the air inside the cabinet is absorbed by the bottom half of the heat pipe core and ambient air is used to draw heat from the top of the core. This conventional assembly is quite large, however, weighing approximately 73 pounds and measuring almost 37 inches high, 7 inches deep, and 19 inches wide.

For cooling small cabinets filled with electronic equipment, such as circuit boards, no suitable heat exchanger has been available up to now and thus fans and filters have generally had to be used. A simple downsizing of known heat exchangers to the size necessary for use in small cabinets would not be adequate since such a heat exchanger would not be capable of transferring a sufficient amount of heat out of the enclosure. Also, in the development of finned heat pipe assemblies for small enclosures, conventional formulas could not be called on to determine the correct sizes of the heat pipes and the fins in relation to the types of fans used, to ensure that a sufficiently large amount of heat could be transferred out of the sealed enclosure.

Accordingly, it has been considered desirable to develop a new and improved heat exchanger assembly which would overcome the foregoing difficulties and others and meet the above-stated needs while providing better and more advantageous overall results.

BRIEF SUMMARY OF THE INVENTION

In accordance with the present invention, a new and improved heat exchanger assembly is provided for cooling the interior of a closed cabinet containing electronic components or the like.

More particularly in accordance with the invention, the heat exchanger assembly comprises a finned heat pipe core including a plurality of spaced, substantially parallel, heat pipe bodies as well as a plurality of spaced fins which are provided with colinear apertures through which each of the plurality of heat pipe bodies can extend. An affixing means is provided for securing the finned heat pipe core to an associated closed cabinet. Also provided are a pair of fans, one being operatively connected with each end of the finned heat pipe core. One of the fans and an associated first end of the heat pipe core is in contact only with the atmosphere inside the associated closed cabinet. The other of the fans and the associated second end of the finned heat pipe core is in contact with only the ambient atmosphere outside the associated cabinet. The fins have a spacing and a thickness which is sized to fit the performance curve of the fans.

In accordance with another aspect of the invention, a heat exchanger assembly is provided for cooling the interior of a closed cabinet containing electronic components or the like.

In accordance with this aspect of the invention, the heat exchanger assembly comprises at least one finned heat pipe core including a plurality of spaced, substantially parallel, heat pipe bodies each of which has a condenser end and an evaporator end. The finned heat pipe core also includes a plurality of spaced fins which are provided with colinear apertures through which each of the plurality of heat pipe bodies can extend. A housing is provided in which the at least one finned heat pipe core is secured. Fastening means are provided for securing the housing to an associated closed cabinet. Also provided are two fans one being operatively connected with each end of the at least one finned heat pipe core. A first of the fans and an associated first end of the at least one heat pipe core is in contact with only the air inside the associated closed cabinet. A second of the fans and an associated second end of the at least one finned heat pipe core is in contact with only the ambient air outside the associated cabinet. The fins have a spacing and a thickness which is sized to fit the performance curve of the fans.

In accordance with a still further aspect of the invention, a heat exchanger assembly is provided for cooling the interior of a closed cabinet containing electronic components or the like.

In accordance with this aspect of the invention, the heat exchanger assembly comprises a finned heat pipe core including a plurality of spaced heat pipes each having a condenser end and an evaporator end as well as a plurality of spaced heat sink fins which are provided with colinear apertures through which the plurality of heat pipes can extend. The plurality of heat pipes are secured to the plurality of fins such that each fin is in thermal contact with each of the plurality of heat pipes. A mounting means is provided for securing the finned heat pipe core to a wall of an associated closed cabinet such that the heat pipe evaporator ends are in communication only with the atmosphere in the interior of the closed cabinet and the heat pipe condenser ends are in communication only with the environment outside the associated cabinet. Also provided are a pair of fans, a first fan being operatively connected to the condenser end of each of the plurality of heat pipes and a second fan being operatively connected to the evaporator end of each of the plurality of heat pipes. A seal means is provided for preventing air circulation between the cabinet and the environment thereby assuring that the heat transfer occurs only through the finned heat pipe core. The fins have a spacing and thickness which are sized to fit the performance curve of the fans. Approximately fourteen heat fins are provided per inch of heat pipe length with each of the fins being approximately 0.008 inches thick. The fins are optimized for the fans whereby the heat exchanger assembly is capable of removing at least 200 watts of heat from the associated cabinet when the temperature in the associated cabinet is at least 20° C. above the ambient temperature.

One advantage of the present invention is the provision of the new heat exchanger assembly which can be used with small sealed enclosures to cool equipment inside the enclosures while the equipment remains isolated from the hostile environment surrounding it.

Another advantage of the invention is the provision of a heat exchanger using a finned heat pipe core and a pair of fans wherein the fins of the heat pipe core have a spacing and a thickness which is sized to fit the performance curve of the fans to ensure that the maximum amount of heat possible can be transferred by the finned heat pipe core.

A further advantage of the invention is the provision of a small heat exchanger which can transfer over 200 watts of heat when the temperature inside a closed cabinet meant to be cooled is approximately 20° C. above the ambient temperature.

Still another advantage of the present invention is the provision of a heat exchanger assembly which can be simply bolted on the exterior of a closed cabinet meant to be cooled and does not need to extend into the cabinet.

Yet another advantage of the present invention is the provision of a heat exchanger assembly which enables a pair of finned heat pipe cores to the positioned in a side-by-side arrangement thereby increasing the amount of cooling that the heat exchanger assembly can provide.

Still yet another advantage of the present invention is the provision of a heat exchanger which is provided with a filter means for filtering at least some of the air passing through the finned heat pipe core.

An additional advantage of the present invention is the provision of a heat exchanger assembly which comprises two pairs of fans, one pair being in contact only with the air inside an associated closed cabinet while the other pair is in contact only with the air outside the associated closed cabinet.

Still other benefits and advantages of the invention will become apparent to those skilled in the art upon a reading and understanding of the following detailed specification.

BRIEF DESCRIPTION OF THE DRAWINGS

The invention may take physical form in certain parts and arrangements of parts, preferred and alternate embodiments of which will be described in detail in this specficiation and illustrated in the accompanying drawings which form a part hereof and wherein:

FIG. 8 is a perspective partially broken away view of an alternate embodiment of the heat exchanger assembly according to the present invention; and, FIG. 9 is an end elevational view in cross section of a heat exchanger assembly according to another alternate embodiment of the present invention.

DETAILED DESCRIPTION OF THE PREFERRED AND ALTERNATE EMBODIMENTS

Figure 2:
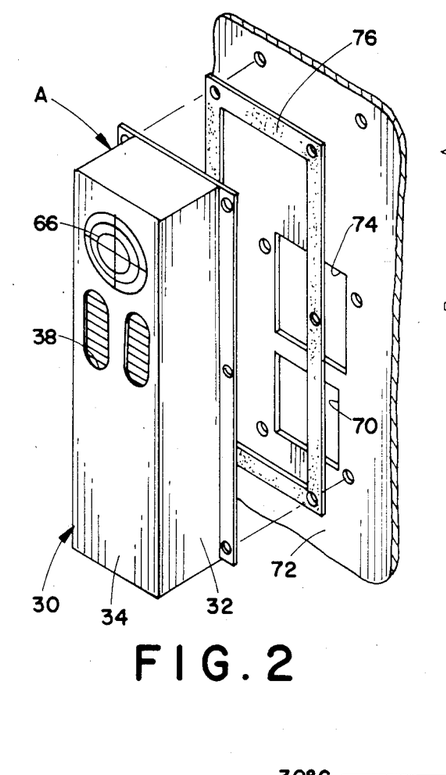
FIG. 2 is a reduced perspective view of the heat exchanger of FIG. 1 secured on an associated cabinet wall surface.

Referring now to the drawings, wherein the showings are for purposes of illustrating preferred and alternate embodiments of the invention only and not for purposes of limiting same, FIG. 2 shows a first preferred embodiment of the subject new heat exchanger A. While the heat exchanger is primarily designed for and will hereinafter be described in connection with the cooling of electronic circuitry in closed cabinets, it will be appreciated that the overall inventive concept could be adapted for use in other heat exchange environments as well.

Figure 1:
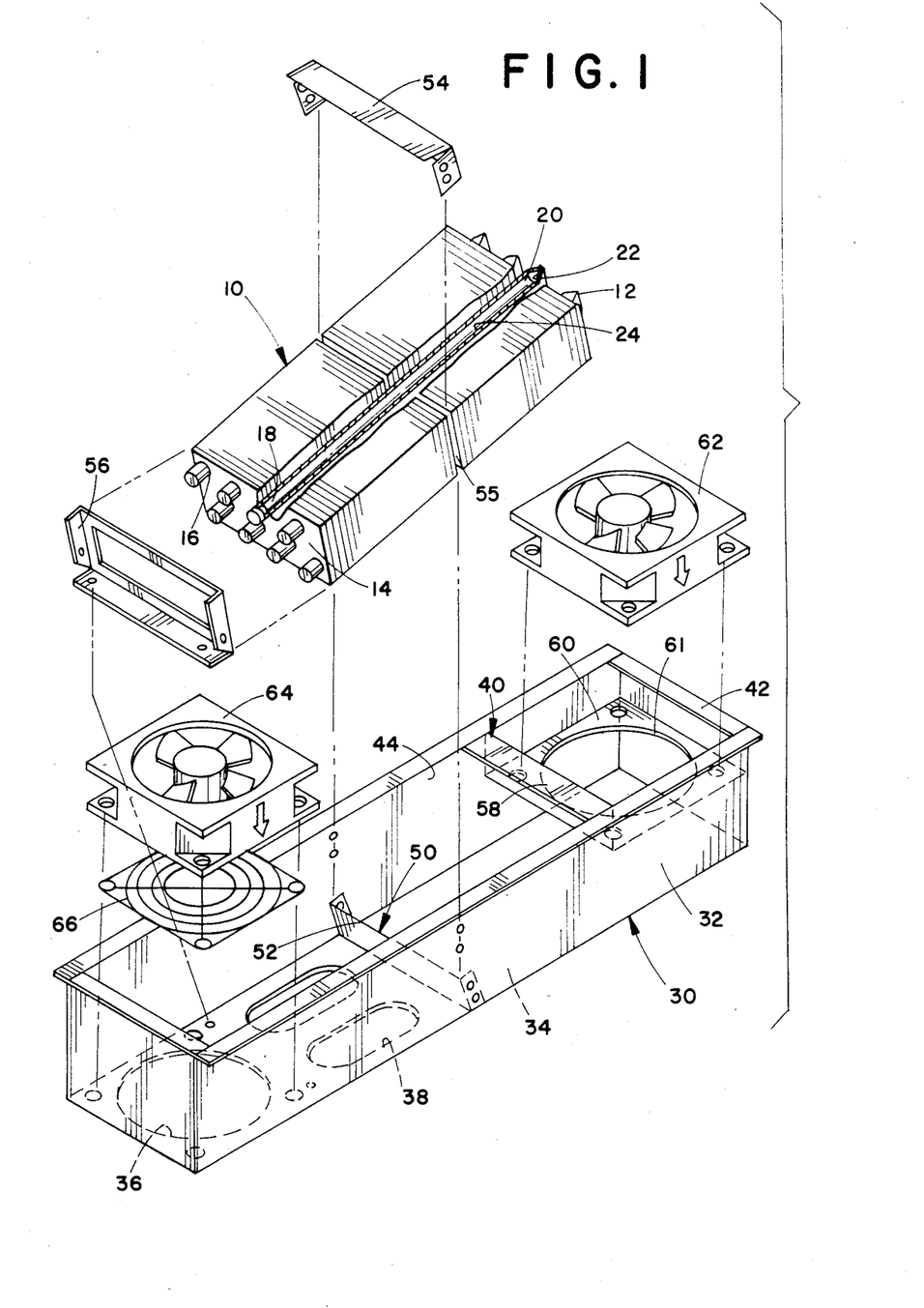
FIG. 1 is an exploded perspective view of a first preferred embodiment of the heat exchanger assembly according the present invention.

With reference now also to FIG. 1, the heat exchanger A of the present invention includes a finned heat pipe core 10 which is comprised of a plurality of heat pipes 12 and fins 14. In this embodiment, two rows of four heat pipes each are provided with one of the rows being offset from the other row. Each of the eight heat pipes 12 extends through all of the plurality of fins 14, through suitable apertures 16 provided therein. The heat pipes are preferably formed from a copper material or the like and are expanded after being positioned in the respective apertures 16 so that they become tightly bound to the fins 14. Such tight binding is also necessary in order to ensure that the heat pipes are able to transmit heat by conduction to the fins 14. The fins, can be made from aluminum or a like material. It should be recognized, however, that other materials can be used for the heat pipes and fins as necessary.

The heat pipes each include an evaporator end 18 and a condenser end 20 as well as a hollow interior 22 in which is positioned a wick structure 24 extending from the evaporator end 18 to the condenser end 20. A suitable vaporizable fluid is placed in a each heat pipe 12 in an amount slightly in excess of that required to completely wet the wick. Thereafter, the pipe is partially evacuated and sealed.

The finned heat pipe core 10 is secured in a housing means 30 which has a plurality of side walls 32. Preferably, the housing means is substantially rectangular in shape and includes besides the side walls 32 a first end face 34 that is provided with a fan opening 36 as well as a pair of air circulation openings 38 that are spaced from the fan opening 36 as well as from each other. The housing means also includes a second face 40 that is substantially open and is circumscribed by a securing flange 42. A suitable securing means such as fasteners or a weld joint can be used to secure the housing means to the associated cabinet at the securing flange.

Secured within an interior periphery 44 of the housing means 30 is a baffle means 50 for preventing air circulation between the respective ends of the housing means. The baffle means includes a bottom baffle 52 (shown as already being secured in a suitable conventional manner within the housing means) as well as a top baffle 54. The two baffles extend partially into a slot 55 formed half way along the finned heat pipe core 10 but do not impede the functioning of the heat pipes 12 of the core. Extending between the top and bottom baffle members is an seal layer (which may be made of epoxy or the like), not visible in FIG. 1, which seals between the several adjacent heat pipes and extends from one of the baffles to the other one. This ensures that no air is able to circulate between the evaporator end 18 and the condenser end 20 of each of the heat pipes.

A core end bracket 56 is secured in a suitable conventional manner to the housing means 30 adjacent a first end of the finned heat pipe core such that the heat pipes 12 can extend therethrough. A bracket 58 is positioned adjacent the other end of the heat pipes and also serves to stiffen the housing means 30. Provided adjacent the bracket 58 is a fan housing 60 having therein a fan opening 61.

A first fan 62 is secured in a suitable conventional manner to the fan housing 60 over the fan opening 61. A second fan 64 is secured in a suitable conventional manner to the housing means 30 over the fan opening 36, and is provided with a protector or finger guard 66. With reference now to FIG. 2, the finger guard 66 prevents inadvertent contact with the blades of the fan, since that could result in injury. The first fan 62 is positioned adjacent a suitable first aperture 70 in an associated cabinet wall 72 to enable the heated cabinet air therein to be drawn in by the fan and circulated around the evaporator ends of the heat pipes and, once cooled, back into the cabinet through a suitable second aperture 74.

A suitable gasket means 76 can also be provided for rendering the assembly substantially air tight thereby preventing any air circulation into and out of the housing means 30 except through the designated openings therein. The housing means 30 can be secured to the cabinet wall 72 by fasteners (not illustrated) or in any other suitable conventional manner.

Figure 3:
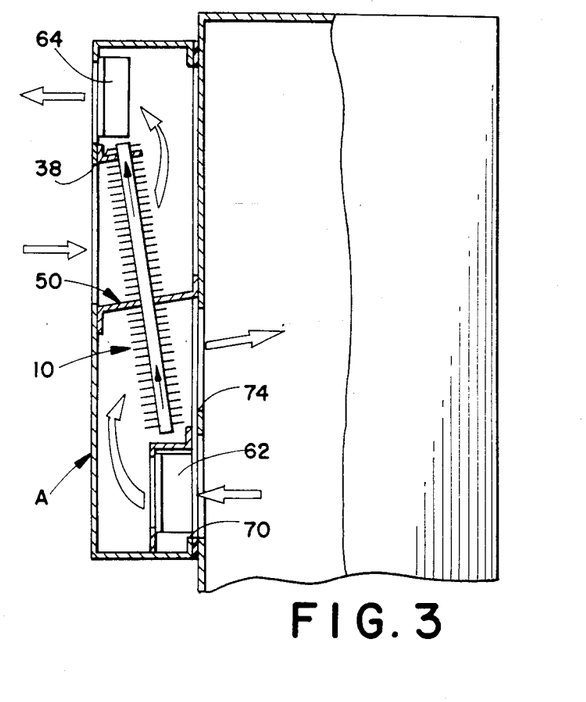
FIG. 3 is a schematic side elevational view of the heat exchanger assembly of FIG. 1 in operation.

With reference now to the schematic view of FIG. 3, it can be seen that the first fan 62 pulls heated cabinet air or other atmosphere into the housing means 30 through the first aperture 70. The air is blown through a lower portion of the finned heat pipe core 10. This will vaporize the refrigerant fluid located in the evaporator end 18 of each heat pipe in the heat pipe core an cause it to move over the condenser end 20 of the heat pipe. At the condenser end, heat is transferred by means of a phase change in the fluid to the environment around the finned heat pipe core. In other words, the first fan 62 blows heated air towards the heat pipe core 10 and transfers heat to the fluid in each heat pipe evaporator end by means of a phase change in the fluid from liquid to vapor. The vapor then rises in each heat pipe 12 until it is at a level above the baffle means 50. At this point, the second fan 64 pulls cooler ambient air or other atmosphere through the opening 38 in the housing means 30 and through the heat pipe core 10 thereby cooling the vapor back to a liquid and drawing heat out of the heat pipe assembly. As the vapor condenses, it gives up its latent heat of vaporization and returns to the liquid state. In this state the fluid returns to the evaporator end of the heat pipe via capillary action along the wick-lined walls of the heat pipe only to be heated and vaporized again continuing the heat transfer cycle.

The plurality of fins 14 provided in the heat pipe core 10 increases the air to heat pipe heat transfer rate while the fans increase the air flow.

It has been determined that since "muffin" fans 62,64 are utilized in the present invention, and since these fans are rated for approximately 30 to 32 watts each, the appropriate number of fins needed per inch of heat pipe length is approximately 14. Also, it has been determined that the thickness of each fin should be approximately .008 inches. This will mean that approximately 0.112 inches of each inch of heat pipe length will be covered fins. Thus, air flow around the heat pipe and between the fins can only take place in the remaining approximately 0.888 inches per inch of heat pipe length.

As explained more thoroughly in the parent application, Ser. No. 727,588, it has been found that the point of optimum operation for a fan in a particular finned heat pipe cooling system involves a tradeoff between two concepts: (1) the greater the fin surface area provided, the greater the amount of heat that can be transferred, and (2) the smaller the air flow channels provided between the fins, the greater the pressure drop across the fan and the lower the amount of air flow and hence the lower the amount of heat that can be transferred out of the system. The point of optimum operation for an approximately 30 to 32 watt muffin fan that has a capacity of at least approximately 100 CFM (cubic feet per minute) of air at free flow (i.e. not through the heat pipe core, the flow through the finned heat pipe core is at least 80 CFM) has been found to occur when approximately 14 fins each of approximately .008 inch thickness are provided per inch of heat pipe length. At this point of optimum operation, the finned heat pipe assembly is able to transfer at least 200 watts of heat when the temperature inside the closed cabinet is approximately 20° C. above the ambient temperature.

Figure 4:
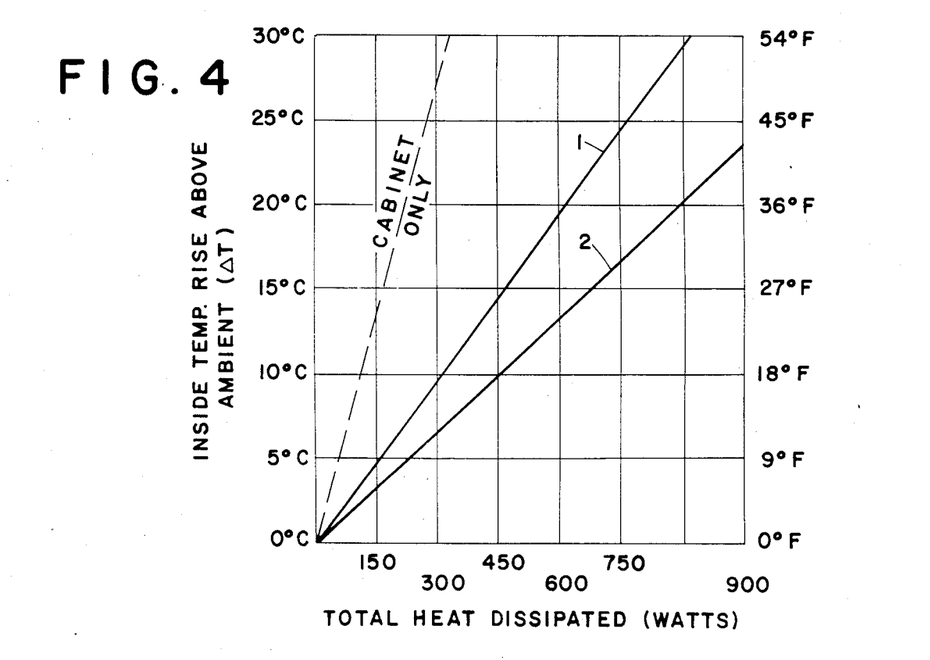
FIG. 4 is a graph showing on the Y axis the inside temperature rise in a closed cabinet and on the X axis the total heat dissipated from the cabinet by the heat exchanger assembly of FIG. 1.

With reference now to the graph of FIG. 4, the inside temperature rise above ambient of a closed cabinet is plotted on the Y axis and the total heat dissipated is plotted on the X axis. It can be seen that in an uninsulated approximately 24×24×16 inch cabinet having an interior temperature that is 20° C. (36° F.) above the ambient the cabinet alone dissipates approximate 195 watts. In this embodiment the fins can be approximately 2 inches by 5 inches and have a thickness and spacing as mentioned. The eight heat pipes can each have a diameter of approximately ½ inch and a length of approximately 11 ¼ inches. With the heat exchanger of this embodiment of the present invention installed, however, approximately 603 watts are dissipated as shown by line 1 of the graph. Therefore, this embodiment of the invention is rated at approximately 408 watts for 20° C. (i.e. 20.4 watts per degree centigrade) -- the difference between watts dissipated by the cabinet alone and watts dissipated by the heat exchanger coupled thereto. This model of the heat exchanger has a power draw of approximately 50 watts and weights approximately 10 pounds. It is able to transfer approximately 1400 BTU per hour at an approximately 20° C. temperature difference.

Another embodiment of the present invention is illustrated by line 2 of the graph. This embodiment was also secured to an uninsulated 24×24×16 inch cabinet. With a temperature rise of 20° C. (36° F.) above the ambient, the cabinet alone is dissipating 195 watts. In this embodiment the fins can be approximately 2 inches by 7.5 inches with the thickness and spacing mentioned above. Twelve heat pipes are provided with the heat pipes each having a diameter of approximately ½ inch and a length of approximately 14.40 inches. With this embodiment of the heat exchanger, installed, 897 watts are dissipated. Therefore, this embodiment of the invention is rated at 702 watts per 20° C. (i.e. 35.1 watts per degree centigrade). The invention in this embodiment utilizes, as mentioned, finned heat pipe core structure with 14 fins per inch and a fin thickness of 0.008 inches. However in this embodiment, the muffin fan used has a capacity of 230 CFM free flow, approximately 200 CFM through the finned heat pipe core. This model has a power draw of approximately 70 watts and weighs approximately 10.25 lbs. Such a heat exchanger is capable of transferring approximately 2400 BTU per hour at a 20° C. temperature rise.

Figure 5:
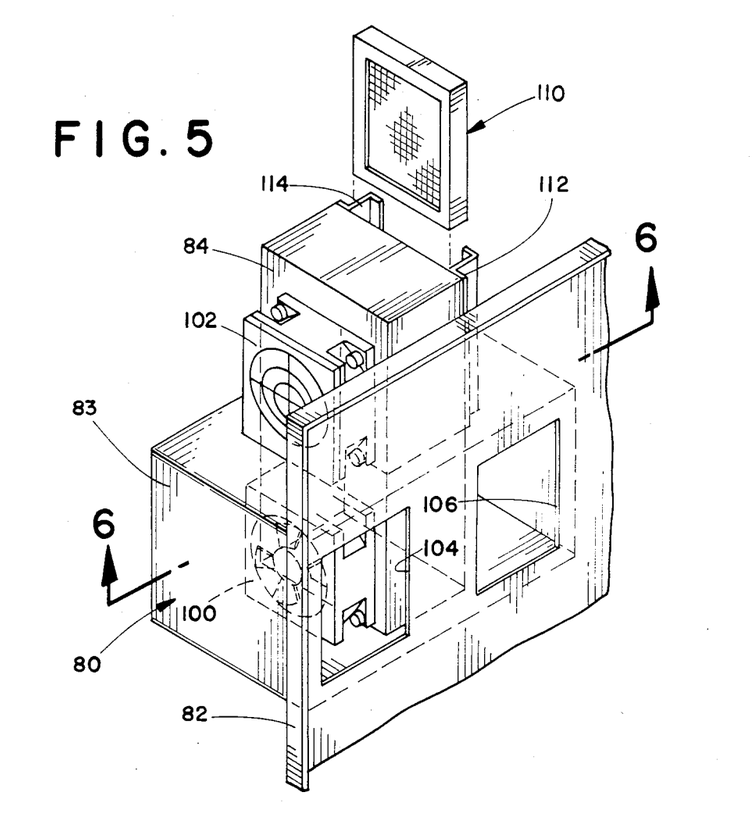
FIG. 5 is a partially exploded perspective view of a second preferred embodiment of the heat exchanger assembly according to the present invention.

With reference now also to FIG. 5, a second preferred embodiment of a heat exchanger according to the present invention is there illustrated. For ease of illustration and appreciation of this alternative, like components are identified by like numerals with a primed suffix (') and new components are identified by new numerals.

Figure 6:
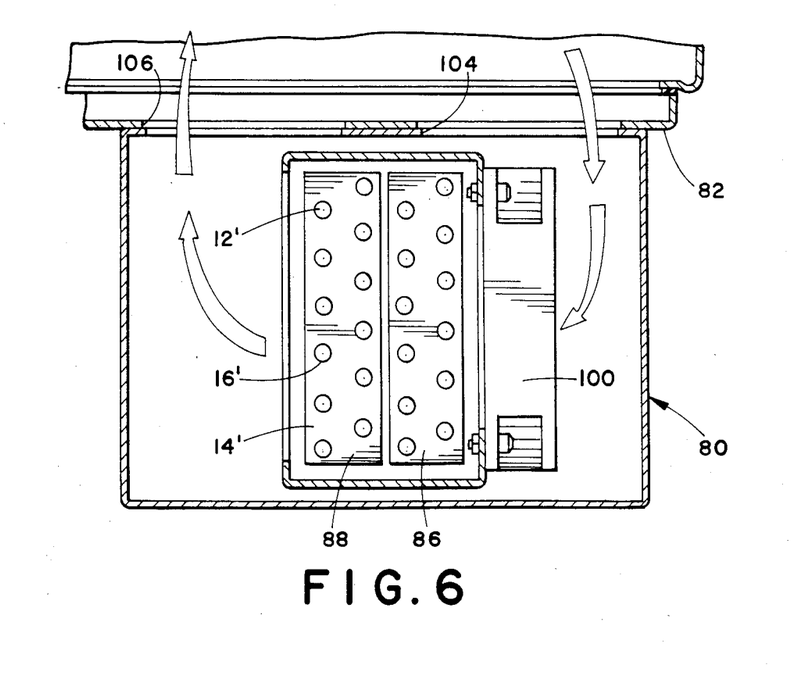
FIG. 6 is an enlarged bottom plan view in cross section of the heat exchanger assembly of FIG. 5.

In this embodiment, the heat exchanger includes a housing means 80 which is adapted to be fastened to a wall of a cabinet or a cabinet door 82, as illustrated. The housing means includes a substantially rectangular first section 83 and a second section 84 which extends transversely therein and houses a pair of adjacent parallel heat pipe cores 86,88 (FIG. 6). In this embodiment, two rows of six heat pipes 12' each are provided with one of the rows being offset from the other row. Each of the twelve heat pipes extends through all of the plurality of fins 14' through suitable apertures 16' provided therein. Each of the heat pipes is tightly bound to each of the fins so that it is able to transmit heat by conduction to the fins.

Also provided are a pair of fans 100,102 with the first fan 100 being positioned inside the housing means 80 and the second fan 102 being positioned on the outside thereof. An adjacent aperture 104 in the door 82 enables the first fan 100 to draw air from the cabinet and push it through the two heat pipe cores 86,88. The air then is returned into the closed cabinet through a second aperture 106 in the door 82 thereof. At the same time, the ambient air is drawn by the second fan 102 through the upper portions of the pair of heat pipe cores 86,88.

Additionally, a filter means 110 can be provided for the second fan 102. This would be useful in a situation where the ambient air is dirty and needs to be filtered before it is drawn through the heat pipe cores 86,88 by the fan 102. Such a filter can be positioned in suitable brackets 112,114 provided on the housing means 80 or in any other type of suitable arrangement.

It has been determined that since the muffin fans 100,102 utilized in the present invention are rated for approximately 30 to 32 watts each, the appropriate number of fins needed per inch of heat pipe length is approximately 14 in an arrangement where each of the fins is approximately 0.008 inches in thickness.

The heat exchanger of FIG. 5 includes, as mentioned, a pair of finned heat pipe cores, each being approximately 14.40 inches in length, approximately 7.50 inches in width, and approximately 2 inches (in depth (i.e. the fins are 2 inches by 5 inches, and the heat pipes are 14.40 inches in length). Each heat pipe core is, as mentioned, provided with twelve heat pipe bodies (having a diameter of approximately ½ inch) extending through the plurality of fins.

Figure 7:
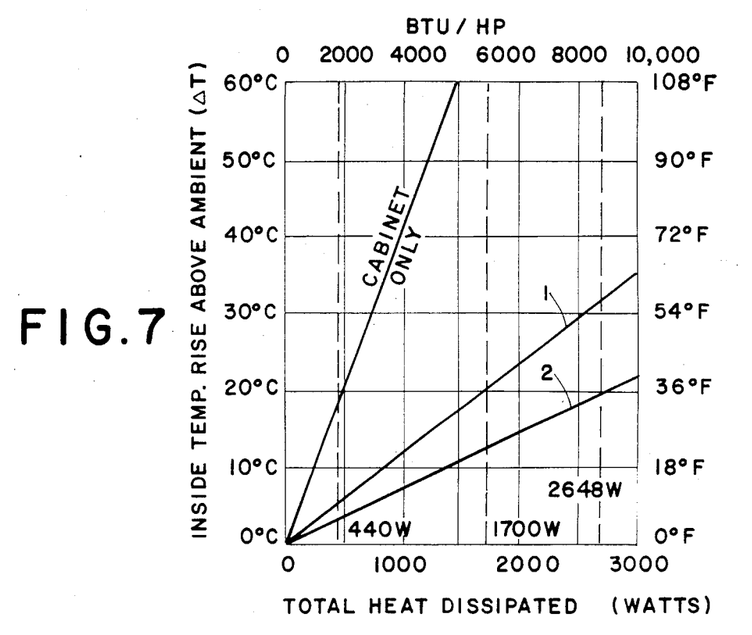
FIG. 7 is a graph showing on the Y axis the inside temperature rise above ambient in a closed cabinet and on the X axis the total heat dissipated from the cabinet by the heat exchanger assembly of FIG. 5.

With reference now to line 1 of the performance data of FIG. 7, it can be seen that at 1700 watts (5800 btu per hour) a heat exchanger according to the embodiment of FIG. 5 will cool the interior of an uninsulated 24×36×72 enclosure down to 20° C. above ambient. Without the heat exchanger of FIG. 5, however, the inside temperature of the cabinet would be approximately 60° C. above ambient. This heat exchanger is thus capable of transferring over 5,000 BTU/hr at a 20° C. temperature rise.

Figures 8, 9:
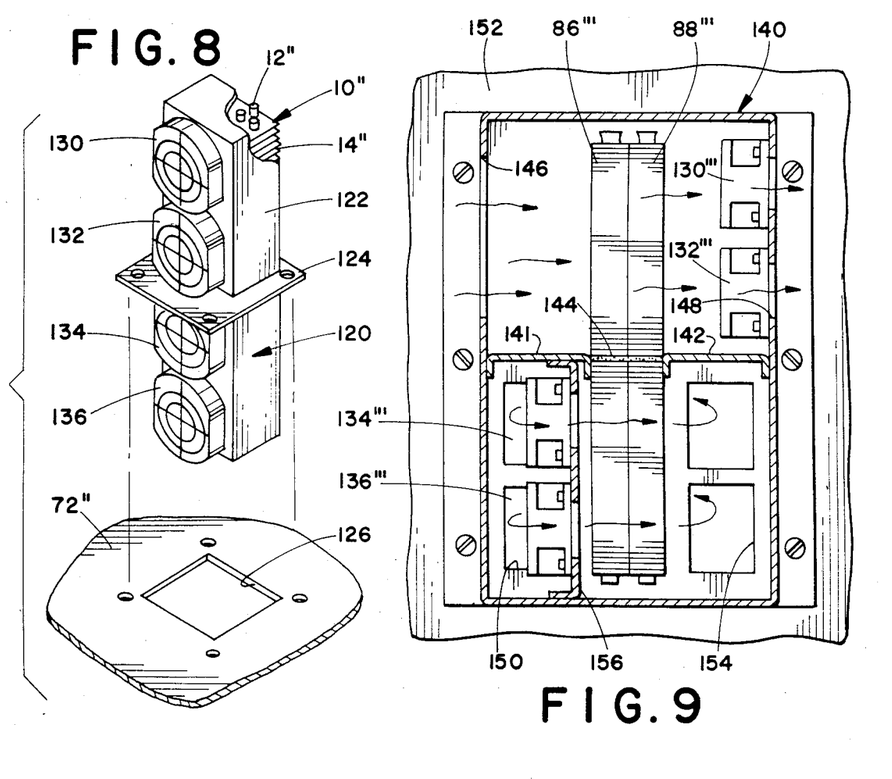

With reference now to the alternate embodiment of FIG. 8, the invention is there shown in a larger heat exchanger which is provided with four fans. For ease of illustration and appreciation of this alternative, like components are identified by like numerals with a double primed suffix (") and new components are identified by new numerals.

In this embodiment, a housing means 120 can be attached to a cabinet wall 72" by a suitable fastening means. The housing means includes a substantially rectangular enclosure 122 holding a finned heat pipe core 10" which has a plurality of heat pipes 12" and fins 14". The enclosure has at the midsection thereof a flange 124 which extends outwardly therefrom and is of a suitable size so as to cover an aperture 126 in the cabinet wall 72".

Also provided are four fins 130,132,134,136 with two of these fans being provided above the flange 124 and the remaining two being provided below it. In this embodiment, the bottom two fans 134,136 as well as the bottom half of the housing means 120 is positioned within the cabinet meant to be cooled and only the upper half of the housing means and the two fans 130,132 attached thereto are located outside the cabinet.

With reference again to FIG. 7, line 2 of the graph illustrated therein illustrates the performance of the heat exchanger of FIG. 8. In this embodiment the fin size is identical to the embodiment of FIGS. 5 and 6 as is the heat pipe diameter, but the heat pipes have a length of approximately 28.8 inches in order to better accomodate the four fans utilized. With a temperature rise of 20° C. (36° F.) above the ambient, an uninsulated 24×36×72 inch cabinet alone is dissipating approximately 440 watts. The typical performance of such a heat exchanger mounted to this cabinet is such that approximatley 2648 watts are dissipated. Thus the heat exchanger is rated at 2208 watt/20° C. This averages out to 110.4 watts per degree centigrade. The 2208 watt rating is the difference between the watts dissipated by the cabinet along and the watts dissipated with the heat exchanger installed on the cabinet. Such a heat exchanger could transfer approximately 7500 BTU per hour at a 20° C. temperature differential. Recognizing that the heat exchanger uses four muffin fans, the power draw is 140 watts.

FIG. 9 illustrates another alternate embodiment of the present invention. For each of illustration and appreciation of this alternative, like components are identified by like numerals with a triple primed suffix (''') and new components are identified by new numerals.

In this Figure, a housing means 140 having four side walls and first and second end walls is suitably adapted to contain a pair of adjacent heat pipe cores 86''',88'''. Also provided are two pairs of fans 130''', 132''', 134''', 136'''. A pair of baffles 141,142 and a suitable sealant layer 144 create separate air flow paths for the ambient air, or other atmosphere, being pulled through the housing by the upper pair of fans 130,132 and the cabinet air being pushed through the housing by the lower pair of fans 134,136. The ambient air is pulled into the housing means 140 through an aperture 146 therein and vented therefrom through apertures 148. Cabinet air is pulled into the housing means through first apertures 150 provided in a cabinet 152 and vented back into the cabinet through apertures 154. The lower fans can be attached to the housing means by suitable fan brackets 156 and the housing means can be secured to the cabinet by fasteners or the like. This embodiment of the heat exchanger is rated at approximately 2500 watts/20° C.

A heat exchanger according to the present invention solves the problem of overheating in sealed enclosures which protect electronic components from airborne dust, oil, dirt, and other contaminates. The problem is solved by cooling and circulating clean air inside the closed cabinet. The heat transferred out of the sealed enclosure by the heat exchanger of the present invention cools the electronics in the enclosure to a temperature slightly above ambient. Heat is continuously removed from the enclosure's interior in order to cool the electronic components without exposing them to the harsh ambient environment.

It should be recognized that other configurations of heat exchangers could also be made, for example, a 3 inch tall 12 inch×12 inch heat exchanger could be designed for rack mounted computer applications and the like. Additionally, it may be conceivable to replace the plurality of spaced individual heat pipes in the heat exchanger with one or more serpentine heat pipe structures which each have a plurality of heat pipe bodies extending through the stacked heat fins. Each of the bodies would then perform the same function as the individual heat pipes discussed above.

The invention has been described with reference to preferred and alternate embodiments. Obviously, modifications and alterations will occur to others upon the reading and understanding of this specification. It is intended to include all such modifications and alterations insofar as they come within the scope of the appended claims or the equivalents thereof.

What is claimed is:

1. A heat exchanger assembly for cooling the interior of a closed cabinet containing electronic components or the like, comprising:
   a finned heat pipe core including:
      a plurality of spaced, substantially parallel, heat pipe bodies, and
      a plurality of spaced fins which are provided with colinear apertures through which each of said plurality of heat pipe bodies can extend, said plurality of heat pipes being secured to said plurality of fins such that each fin is in thermal contact with at least one of said plurality of heat pipes;
   a second finned heat pipe core, said two cores being positioned in a side-by-side arrangement;
   affixing means for securing said finned heat pipe cores to an associated closed cabinet; and,
   a pair of fans, one being operatively connected with each end of said finned heat pipe cores, one of said fans, and an associated first end of each of said heat pipe cores, being in contact with only the atmosphere inside said associated closed cabinet, the other of said fans and an associated second end of each of said finned heat pipe cores being in contact with only the ambient atmosphere outside said associated cabinet, and wherein said fins have a spacing and a thickness which is sized to fit the performance curve of said fans, wherein said fans each have a capacity of approximately 100 CFM (cubic feet per minute) and wherein said finned heat pipe cores are optimized for said fans such that approximately fourteen fins are provided per inch of heat pipe length with each of said fins being approximately 0.008 inches in thickness, whereby said finned heat pipe cores and said pair of fans are capable of transferring at least 200 watts of heat when the temperature inside said associated cabinet is approximately 20° C. above the ambient temperature.

2. The assembly of claim 1 further comprising a filter means for filtering at least some of the atmosphere passing through said finned heat pipe cores.

3. The assembly of claim 1 further comprising a second pair of fans, a first fan of said second pair of fans being positioned adjacent said one fan, a second fan of said second pair of fans being positioned adjacent said other fan.

4. The assembly of claim 1 wherein said affixing means includes:
   a container structure in which said finned heat pipe cores are held and to which said two fans are secured;
   a flange structure which is adapted to close an aperture in said associated cabinet, said container structure being secured to said flange structure and a portion of said container structure and one of said fans being positioned inside said associated cabinet; and,
   a plurality of fasteners for securing said flange structure to said associated cabinet.

5. The assembly of claim 1 wherein said affixing means includes:

a container structure in which said finned heat pipe cores are held and to which said fans are secured; and, a fastening means for securing said container structure to said associated cabinet.

6. The assembly of claim 5 wherein said container structure is secured on an exterior wall of said associated cabinet such that said finned heat pipe cores do not extend into said associated cabinet.

7. The assembly of claim 5 wherein said container structure comprises:

a rectangular housing having four side walls and a pair of opposing end walls, a first end wall facing said associated cabinet and a second end wall facing away from said associated cabinet, said first end wall being substantially open in a first section to allow an evaporator end of each of said finned heat pipe cores to communicate with the atmosphere inside said associated cabinet, said second end wall being substantially open in a first section to allow a condenser end of each of said finned heat pipe cores to communicate with the ambient atmosphere; and, a baffle extending in said rectangular housing to prevent atmospheric flow between said condenser end and said evaporator end of each of said finned heat pipe cores.

8. A heat exchanger assembly for cooling the interior of a closed cabinet containing electronic components or the like, comprising:

at least one finned heat pipe core including:

a plurality of spaced, substantially parallel heat pipe bodies each having a condenser end and an evaporator end, and a plurality of spaced fins which are provided with colinear apertures through which each of said plurality of heat pipe bodies can extend, each of said plurality of heat pipes being secured to at least one of said plurality of fins such that each fin is in thermal contact with at least one of said plurality of heat pipes;

a housing in which said at least one finned heat pipe core is secured;

fastening means for securing said housing to an associated closed cabinet; and, two fans, one being operatively connected with each end of said at least one finned heat pipe core, a first of said fans, and an associated first end of said at least one heat pipe core, being in contact with only the air inside said associated closed cabinet, a second of said fans and an associated second end of said at least one finned heat pipe core being in contact with only the ambient air outside said associated cabinet, and wherein said fins have a spacing and a thickness which is sized to fit the performance curve of said fans wherein said fans each have a capacity of approximately 230 CFM (cubic feet per minute) free flow and wherein said at least one finned heat pipe core is optimized for said fans such that approximately fourteen fins are provided per inch of heat pipe length with each of said fins being approximately 0.008 inches in thickness, whereby said finned heat pipe core and said pair of fans are capable of transferring at least 400 watts of heat when the temperature inside said associated cabinet is approximately 20° C. above the ambient temperature.

9. The assembly of claim 8 wherein the heat pipes are made from copper and said fins are made from aluminum.

10. The assembly of claim 9 further comprising seal means for sealing said housing against said associated cabinet and for preventing air flow between the ends of said heat pipes to prevent heat transfer between said associated cabinet and the environment except through said finned heat pipe core.

11. The assembly of claim 8 wherein said first fan blows air toward said finned heat pipe core and wherein said second fan blows air away from said finned heat pipe core.

12. The assembly of claim 1 further comprising a filter means for filtering at least some of the air passing through said finned heat pipe core.

13. The assembly of claim 1 further comprising a second pair of fans, a first of said second pair of fans being positioned adjacent said first fan, a second of said second pair of fans being positioned adjacent said second fan.

14. A heat exchanger assembly for cooling the interior of a closed cabinet containing electronic components or the like, comprising:

a finned heat pipe core including:

a plurality of spaced heat pipes, each having a condenser end and an evaporator end, and a plurality of spaced heat sink fins which are provided with colinear apertures through which said plurality of heat pipes can extend, said plurality of heat pipes being secured to said plurality of fins such that each fin is in thermal contact with each of said plurality of heat pipes;

mounting means for securing said finned heat pipe core to a wall of an associated closed cabinet such that said heat pipe evaporator ends are in communication only with the atmosphere in the interior of said associated cabinet and said heat pipe condenser ends are in communication only with the environment outside said associated cabinet;

a pair of fans, a first fan being operatively connected to said condenser end of each of said plurality of heat pipes, and a second fan being operatively connected to said evaporator end of each of said plurality of heat pipes; and, a second pair of fans, a first of said second pair of fans being positioned adjacent said first fan, a second of said second pair of fans being positioned adjacent said second fan;

seal means for preventing air circulation between said cabinet and the environment thereby assuring that heat transfer occurs only through said finned heat pipe core, wherein said fins have a spacing and thickness which are sized to fit the performance curve of said fans, wherein approximately fourteen heat sink fins are provided per inch of heat pipe length, with each of said fins being approximately 0.008 inches thick, said fins being optimized for said fans which have a capacity of at least 100 CFM whereby said finned heat pipe core and said first and second pairs of fans are capable of removing at least 200 watts of heat from said associated cabinet when the temperature in said associated cabinet is at least 20° C. above the ambient temperature.

15. The assembly of claim 14 further comprising a second finned heat pipe core, said cores being positioned in a side-by-side arrangement.

16. The assembly of claim 14 further comprising a filter means for filtering at least some of the atmosphere passing through said finned heat pipe core.

17. The assembly of claim 1 further comprising seal means for sealing said housing against said associated cabinet and for preventing air flow between the ends of said heat pipes to prevent heat transfer between said associated cabinet and the environment except through said finned heat pipe core.

* * * * *